United States Patent
Wolfson et al.

(10) Patent No.: US 9,967,373 B2
(45) Date of Patent: May 8, 2018

(54) TEST AND TRAINING ENABLING ARCHITECTURE GATEWAY IMPLEMENTED ON A CHIP

(71) Applicant: The United States of America as represented by the Secretary of the Army, Washington, DC (US)

(72) Inventors: Scott C Wolfson, Harvest, AL (US); Jeremiah W. Langston, Huntsville, AL (US); Adam W Turnbull, Owens Cross Roads, AL (US)

(73) Assignee: The United States of America as represented by The Secretary of the Army, Washington, DC (US)

( * ) Notice: Subject to any disclaimer, the term of this patent is extended or adjusted under 35 U.S.C. 154(b) by 36 days.

(21) Appl. No.: 15/288,542

(22) Filed: Oct. 7, 2016

(65) Prior Publication Data
US 2017/0104853 A1    Apr. 13, 2017

Related U.S. Application Data

(60) Provisional application No. 62/238,262, filed on Oct. 7, 2015.

(51) Int. Cl.
*H04J 3/24*      (2006.01)
*H04L 29/08*     (2006.01)
*H04L 29/06*     (2006.01)
*H03K 19/177*    (2006.01)

(52) U.S. Cl.
CPC ..... *H04L 69/324* (2013.01); *H03K 19/17724* (2013.01); *H04L 69/22* (2013.01)

(58) Field of Classification Search
CPC .. H04L 69/324; H04L 69/22; H03K 19/17724
See application file for complete search history.

(56) References Cited

U.S. PATENT DOCUMENTS

| | | | | |
|---|---|---|---|---|
| 9,832,111 B2 * | 11/2017 | Zhou | ................ | H04L 45/38 |
| 2012/0082030 A1 * | 4/2012 | Yasuda | ................ | H04L 1/188 370/230 |

* cited by examiner

*Primary Examiner* — Afshawn M Towfighi
(74) *Attorney, Agent, or Firm* — Karen G. Hazzah (57) ABSTRACT

Disclosed herein is a specialized integrated circuit for a Test and Training Enabling Architecture (TENA) gateway. The specialized integrated circuit comprises a packet parser, a TCP packet handler, generic TENA packet generator(s), and object model specific TENA packet generator(s). The packet parser parses an incoming MAC layer packet and conditionally provides a TCP packet to the TCP packet handier, depending on header(s) in the MAC layer packet. The TCP packet handler parses the TCP packet to reveal a TENA message, and determines whether the TENA message involves object model specific data and selectively provides the TENA message to the generic TENA packet generator(s) or to the object model specific TENA packet generator(s). The selection is based on the object model specific data determination. The selected TENA packet generator constructs an outgoing TENA message in response to the provided TENA message.

15 Claims, 5 Drawing Sheets

TEST AND TRAINING ENABLING ARCHITECTURE GATEWAY IMPLEMENTED ON A CHIP

CROSS REFERENCE TO RELATED APPLICATIONS

This application claims the benefit of U.S. Provisional Application No. 62/238,262 ("Test and Training Enabling Architecture on a Field Programmable Gate Array (TOAF)"), filed Oct. 7, 2015, the contents of which are incorporated by reference herein.

FIELD OF THE INVENTION

This application relates to implementing or instantiating a particular type of gateway (for Test and Training Enabling Architecture) in silicon, i.e., on a chip.

BACKGROUND

Weapons testing and/or training uses various sensors to take measurements at a weapons range. (As used herein, the term "range" refers to an area where weapons are tested.) The system under test communicates and cooperates with various range assets in the form of tracking, monitoring, simulation, and control system(s). The testing and training events involve real weapons, se real measurements are gathered in real-time. A particular sensor system may include half a dozen to several hundred individual component sensors, and the sensor systems are themselves inherently distributed, typically over a large geographic area. As a result, military ranges are generally large-scale, distributed, real-time and embedded (DRE) systems.

These weapon systems and range assets are often designed, developed, and manufactured by different contractors, for different military commands, even across different branches of the military. The Department of Defense (DoD) has developed a test architecture known as Test and Training Enabling Architecture (TENA) which enables these disparate systems to interoperate. TENA defines a common language, establishes a communication mechanism, and provides context that enables divergent systems to communicate via a middleware framework. (See "TENA: The Test and Training Enabling Architecture Reference Document," available from the TENA Software Development Activity at www.tena-sda.org).

The interoperability provided by TENA allows the DoD to leverage its field infrastructure investments across the DoD, to foster reuse of range assets, and to reduce the cost of future range assets. There is an ever increasing need to miniaturize on-system instrumentation and provide standardized real-time control, status, and/or data links between field instrumentation suites, tactical systems, and networked computers during test events. To complicate matters further, these instrumentation suites are typically not collocated and may be exposed to the harsh environments at an open air test range, in a vehicle, or on an aircraft. TENA provides this functional capability but limiting factors such as software execution efficiency, command/response time, and computer platform requirements for Size Weight and Power (SWaP) can impose use case constraints in closed-loop situations, and with other test activities where command/response times are critical.

SUMMARY

Embodiments disclosed herein implement TENA in silicon, for example, a Field Programmable Gate Array (FPGA) or an Application Specific Integrated Circuit (ARC). Implementing TENA in silicon addresses requirements that arise in the environment in which weapons systems are deployed or tested. Field instrumentation operates in the same environment as the tactical articles under test, yet should not adversely affect the operator or the operation of the test article due to Size, Weight, and Power (SWaP) requirements. Implementing TENA on silicon allows test instrumentation to meet or exceed a desired operational temperature range (a typical range is −40 degrees-70 degrees C.), and reduces SWaP as compared to a processor implementation.

DETAILED DESCRIPTION

Embodiments disclosed herein implement TENA in silicon, for example, a Field Programmable Gate Array (FPGA) or an Application Specific Integrated Circuit (ASIC). Implementing TENA in silicon addresses requirements that arise in the environment in which weapons systems are deployed or tested. Field instrumentation operates in the same environment as the tactical articles under test, yet should not adversely affect the operator or the operation of the test article due to Size, Weight, and Power (SWaP) requirements. Implementing TENA on silicon allows test instrumentation to meet or exceed a desired operational temperature range (a typical range is −40 degrees-70 degrees C.), and reduces SWaP as compared to a processor implementation.

The concurrent nature of TENA in silicon provides other benefits such as improved rate efficiency in the TENA interface, and/or predictable message periodicity. These benefits can be measured by message rate and/or message rate periodicity. Embodiments of the TENA gateway chip disclosed herein concurrently processes Ethernet messages (incoming and outing) and instrumentation data. Examples of such processing include parsing of received messages, determination of message type, generating response messages, TENA initialization sequence of operation control, formatting of instrumentation data, management of Transmission Control Protocol (TCP) connections, User Datagram Protocol (UDP) message transactions, implementation of Address Resolution Protocol (ARP), and implementation of Internet Control Message Protocol (ICMP).

As used herein, the term "chip" refers to an integrated circuit (IC), which is made up of a combination of logic gates. As used herein, the term "specialized chip" refers to an IC, which is IC with logic gates interconnected in a specific way to achieve a particular functionality. The functionality provided by embodiments of the TENA gateway chip as disclosed is that of a TENA gateway. TENA gateway chips disclosed herein implement true hardware concurrency. In contrast, software which executes on a processor as a stream of instructions, and thus is serial in nature rather than concurrent. Even multitasking of software tasks only appears to be concurrent, as the processor switches from one task to another.

Although multi-core processors can be viewed as providing concurrent execution of instruction streams, TENA gateway chips disclosed herein are nonetheless different because processors are, by nature, designed to accomplish many different types of functions. These functions are expressed in software as different combinations of instructions. In contrast, a specialized chip such as a TENA gateway chip is designed not to execute instructions, but instead to accomplish a particular set of functions (set at design time) in silicon, using a specific combination of logic gates. The specificity of the design in a leads to improved performance when the design is implemented in silicon, as compared to a solution that uses software running on a processor.

Some chips, even specialized chips, may include a processor core. However, TENA gateway chips Another difference between a TENA gateway PC and some of the gateway chip embodiments disclosed herein involves the protocol stack. Because a PC runs an operating system and other system level software, the protocol stack on a TENA gateway PC includes presentation and application layers used by these software components. The TENA gateway chip does not include this software, and is therefore not required to include these highest layers of the protocol stack. The TENA gateway chip may instead use the session layer as the highest layer of the stack.

Figure 1:
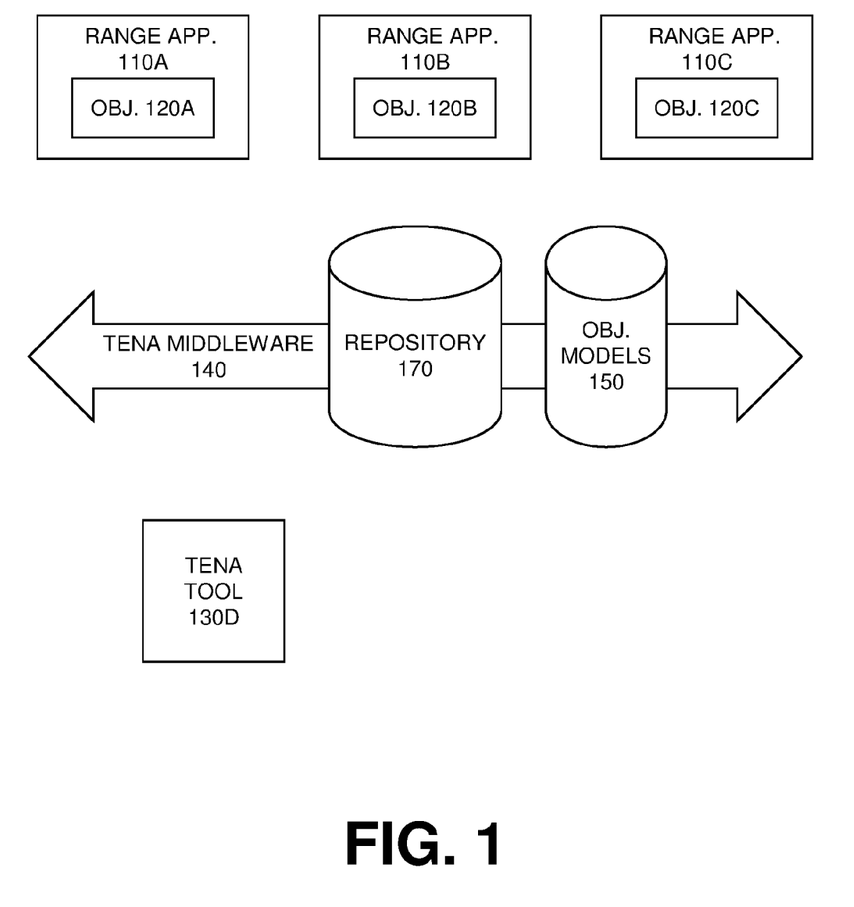
FIG. 1 is a high level block diagram showing various software components in the Test and Training Enabling Architecture (TENA), according to embodiments disclosed herein.

FIG. 1 is a high level block diagram showing various software components in the Test and Training Enabling Architecture (TENA). TENA Range Resource Applications 110A, B, C are range instrumentation applications that gather sensor data, or applications that process range data obtained from sensors. A Range Resource Application 110 includes one or more TENA objects 120, each representing a measurement from a range sensor. TENA Tools 130 are applications that facilitate the management of a (logical) range through the entire lifecycle of range events. TENA Tools 130 are generally reusable across different tests and weapons, and often communicate with Non-TENA systems and applications.

TENA Middleware 140 provides real-time information exchange between software components. To this end, TENA Middleware 140 uses TENA Object Models 150, which form the common language used for communication between all range resources and tools. TENA Object Models 150 may contain standard object definitions (defined in TENA) as well as non-standard (user-defined) object definitions. The particular set of objects used in a logical range is called the logical range object model (LROM). TENA Middleware 140 connects TENA applications through a publish/subscribe interface, through which a TENA Application 110 subscribes to object information 120 published by other TENA Application(s) 110.

In this example, Range Resource Application 110A is a radar application and includes time and position measurements 120A-1 . . . 120A_N for an object being tracked. Range Resource Application 110B is an acoustic sensor application and includes acoustic data 120B gathered during a test. Range Resource Application 110C is an accelerometer application collocated with the weapon under test (i.e. Hardware in the Loop) and includes accelerometer data 120C. TENA Tool 130D is a monitoring application that monitors a test of the weapon by processing sensor data obtained from TENA Resource Applications 110A-C. More specifically, Monitoring Tool 130D subscribes to time/position., acoustic, and accelerometer objects 120A, B, and C (respectively) that are published by Range Resource Applications 110A-C (respectively).

Continuing with the description of TENA software components, Event Data Management System 160 stores scenario data, data collected during an event, and summary information. TENA Repository 170 stores applications, object models, and other information shared between logical ranges. TENA Tools 130 are often stored in Repository 170 and made available to the community that is involved in weapons testing. TENA Utilities 180 are applications specifically designed to address issues related to usability or management of the TENA logical range. Finally, although not shown in this diagram, TENA may interact with Non-TENA Applications such as range instrumentation/processing systems, systems-under-test, simulations, and Command, Control Communications, Computers, intelligence, Surveillance, and Reconnaissance (C4ISR) systems that are not built in accordance with TENA, but are nonetheless used in a test or training event.

FIG. 1 shows how TENA components interoperate at a logical level, but does not show how the components are implemented, and in particular, does not show a division between hardware and/or software. Conventional systems have implemented TENA Applications 120 as software executing on a PC hardware platform (not shown). Such an implementation is often referred to as a "TENA Gateway," since the application software allows an instrument, sensor, or sensor system that is ignorant of TENA to nonetheless communicate with Range Resource Applications 110 through TENA Middleware 140. In contrast, the inventive approach disclosed herein moves the TENA functionality closer to the weapon under test or field instrumentation, by implementing the TENA gateway functionality in silicon, resulting in a much smaller footprint.

Figure 2:
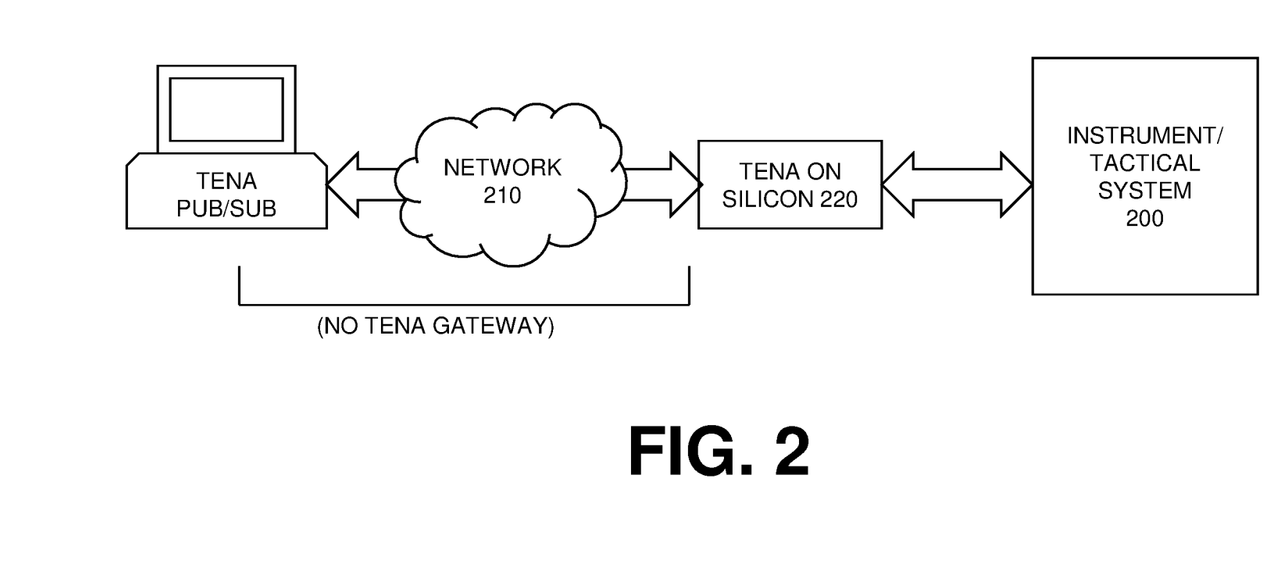
FIG. 2 is a logical diagram showing communication via a TENA gateway chip, according to embodiments disclosed herein.

FIG. 2 is a logical diagram showing communication via a TENA gateway chip. Instrument 200 generates sensor data and communicates this data over network 210 to Range Resource Application 110. More specifically, one or more sensors of instrument 200 obtain the data, then TENA gateway chip 220 transforms the sensor data according to an object model 150 (see FIG. 1), and then publishes this data to subscriber Range Resource Application 110 over network 210. Although FIG. 2 focuses on hardware rather than software components, persons of ordinary skill in the art will understand how TENA Middleware 140 and other software components enable this communication. Notably, TENA gateway chip 220 conforms to TENA requirements and communicates with TENA Middleware 140 in the same manner as that TENA Middleware 140 communicates with other TENA applications 110. As a result, instrument 200 behaves like any other TENA Range Resource Application 110 from the viewpoint of TENA Middleware 140. However, because the TENA functionality of instrument 200 is implemented directly on silicon rather than as instructions executing on a processor, instrument 200 improves both real-time response and the SWaP footprint. In some embodiments, TENA gateway chip 220 and instrument 200 are separate components, for example TENA gateway chip 220 is provided on a printed circuit board that is installed in the chassis of instrument 200. However, persons of ordinary skill in the art will also appreciate that that TENA gateway chip 220 and instrument 200 can be integrated onto the same board or even the same chip.

Figure 3:
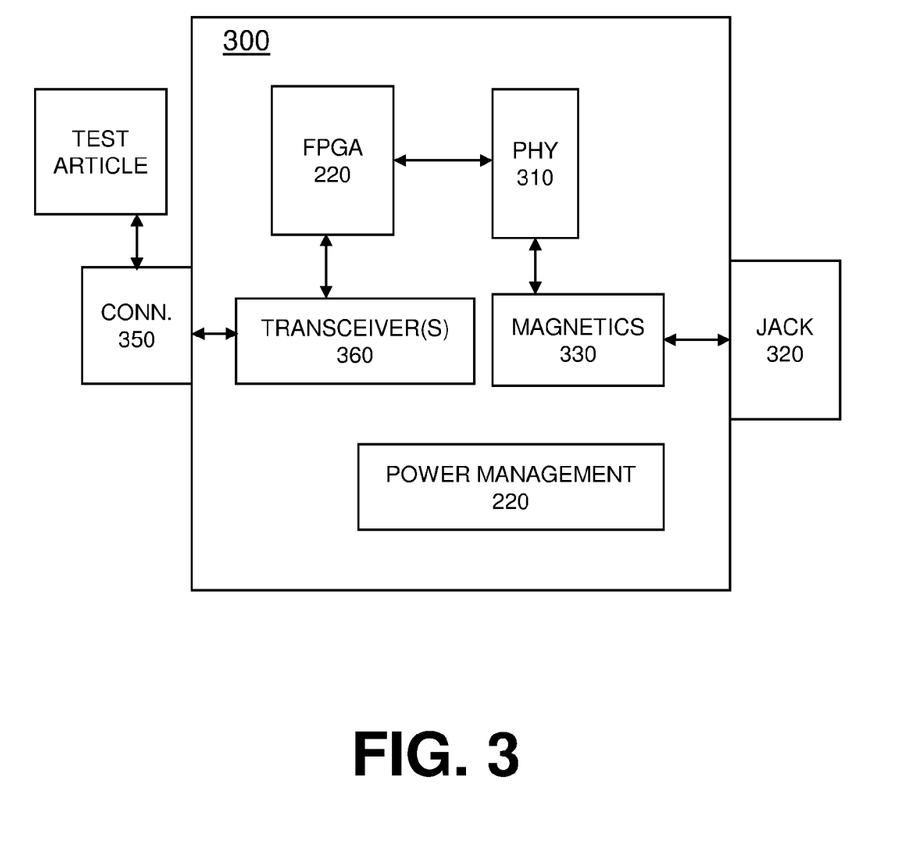
FIG. 3 is a block level diagram for a device that includes TENA implemented in silicon, according to embodiments disclosed herein.

FIG. 3 is a block level diagram for a device that includes TENA implemented in silicon. In this example the device takes the form of a printed circuit board (PCB) 300 with various electronic components mounted thereon, including TENA gateway chip 220. As described herein, TENA gateway chip 220 implements many application-level functions of the Test and Training Enabling Architecture in hardware using gates arranged in specialized logic blocks. In some embodiments, TENA gateway chip 220 is implemented as a Field Programmable Gate Array (FPGA) such as the Altera Aria® II GX, while in other embodiments the silicon takes the form of an Application Specific Integrated Circuit (ASIC). The functionality of TENA gateway chip 220 may be described in Hardware Description Language (HDL) such as Verilog or VHDL. In some embodiments, TENA gateway chip 220 is reprogrammable, which allows new functionality to be added, or modifications to existing functionality to be made. For example, changes can be made to object model. In other embodiments, TENA gateway chip 220 is programmed once, at the time of design or manufacture, or in the field.

Also included on PCB 300 are a physical layer (PHY) network interface 310, a PHY connector 320, PHY coupling 330, a test article/instrumentation interface 340, a test article/instrumentation connector 350, and a test article/ instrumentation transceiver 360. Although shown as separate components in FIG. 3, one of ordinary skill in the art will appreciate that one or more of these components can be integrated.

As discussed above, TENA gateway chip 220 obtains measurements from instrument 200 (see FIG. 2), and treats this data as an object 120 (see FIG. 1) as defined by an object model 150 (see FIG. 1). TENA gateway chip 220 communicates with instrument 200 via test interface 340 and test connector 350. Test interface 340 may be a serial interface, for example, RS-232 or RS 422. Optional transceiver 360 converts signals going to/from test interface 340 to a signal format, type, format that is appropriate for the particular test interface 340.

TENA gateway chip 220 communicates with network 210 (see FIG. 2) using PHY 310 and PHY connector 320. In some embodiments of PCB 300, PHY 310 is a Gigabit Ethernet (GigE) PHY, but other network speeds and types may be utilized. PRY coupling 330 converts the digital signals of TENA gateway chip 220 to the appropriate signal type and signal level used by PHY connector 320 and by network 210, for example, through transformers and/or magnetics.

Figure 4:
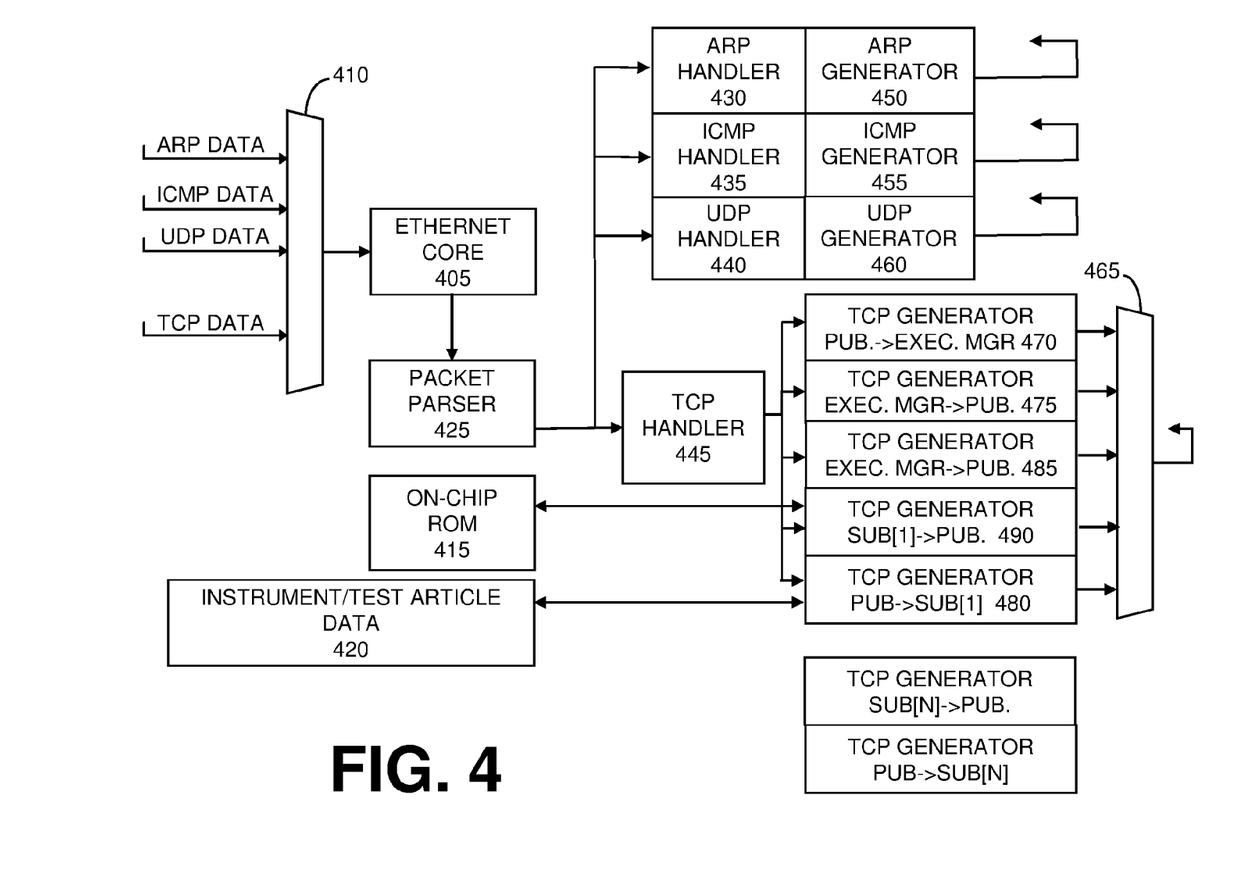
FIG. 4 is a block level diagram showing various functional Hocks of a TENA gateway chip, according to embodiments disclosed herein.

FIG. 4 is a block level diagram showing various functional blocks of TENA gateway chip 220. MAC layer 405 implements the Media Access Control layer of the networking function by sending and receiving MAC-level packets communicated over network 210 (see FIG. 2), for example, Ethernet packets. In some embodiments, MAC layer 405 is implemented with a commercial off-the-shelf intellectual property (IP) core rather than with custom logic. Output data multiplexer 410 detects the presence of available packets from various packet generator blocks (described below), and provides packets in a serial manner to MAC layer 405 for transmission onto network 210. Object data storage 415 stores TENA object model data that is specific to the particular instrumentation or application managed by the of TENA gateway chip 220. TENA gateway chip 220 uses this object model data when constructing TENA messages sent to the TENA Execution Manager, as will be discussed in more detail below. In some embodiments, object data storage 415 takes the form of ROM, while in other embodiments RAM is used. In some embodiments, object data storage 415 externally located on PCB 300 rather being on-chip. Instrument data storage 420 stores data obtained from instrument 200. Such instrument specific data may undergo format conversion before the data is inserted into a TENA request or reply message.

Many of the functional blocks on TENA gateway chip 220 relate to either processing packets received by MAC layer 405, or to generating packets for transmission by MAC layer 405. Outgoing packets may be transmitted in response to received packets, or in response to a request from a TENA publisher, a TENA subscriber, or the TENA Execution Manager (see below). Packet parser 425 inspects the header(s) of incoming packets received from network 210 (see FIG. 2) and determines the protocol type (e.g., ARP, ICMP, UDP, TCP). Based on the protocol type, packet parser 425 sends the received packet on to the appropriate packet handler block: ARP packet handler 430, ICMP packet handler 435, UDP packet handler 440, or TCP packet handler 445. Persons of ordinary skill in the art will understand that packets are encapsulated in a layered manner according to a protocol stack, and will understand that protocol types are sometimes determined by examining a header at one particular layer, and sometimes determined by examining multiple headers at different layers. For example, determining that a packet is a TCP packet may involve examining both a MAC (e.g., Ethernet) header and a network (e.g., IP) header, while determining that a packet is an ARP packet does not typically require examination of the network header.

After parsing, appropriate packet handling sometimes involves generating a response for transmission, and this is performed by ARP packet generator 450, ICMP packet generator 455, UDP packet generator 460, or one of several TCP packet generators described below. The packets output by these TCP packet generators pass through a TCP output multiplexer 465 which serializes the packets for delivery to MAC layer 405. ARP packet handler 430 implements address resolution according to the ARP protocol. To this end, ARP packet handler 430 detects receipt Of an ARP request packet and triggers ARP packet generator 450 to generate and then transmit an appropriate ARP response packet. ARP packet handler 430 also generates ARP request packets and sends them to other layer-2 devices on network 210 (see FIG. 2) as needed to perform address resolution. ICMP packet handler 435 implements the ICMP protocol. To this end, ICMP packet handler 435 detects receipt of an ICMP request packet and triggers ICMP packet generator 455 to generate and then transmit an appropriate ICMP response packet. ICMP packet handler 435 also generates ICMP request packets and sends them to other layer-2 devices on network 210 (see FIG. 2) as needed to perform address resolution. As noted earlier, packets created by one of these generators go through output mux 410 in order to be transmitted by MAC layer 405.

TCP packets are processed differently, in that TCP packet handler 445 detects receipt of a TCP packet and then triggers the appropriate one of several TCP packet generators, based on TENA header information. In one embodiment, TCP packet handler 445 examines the TCP packet to reveal the TENA message carried within, then provides the TENA message to a TCP packet generator as. Each TCP packet generator is responsible for a set of TENA messages, so these TCP packet generators can also be viewed as TENA packet generators. The TENA packet generators work together to implement TENA publish/subscribe operations for managed objects, thus forming a TENA Gateway.

As mentioned above, TENA Middleware 140 (FIG. 1) acts as an intermediary to connect object publishers and object subscribers. An Execution Manager component (not shown) of TENA Middleware 140 provides subscription join, resign, or change operations. Once a subscription is established between a publisher and a subscriber, the entities can communicate without the Execution Manager. TENA gateway chip 220 acts in the role of a publisher of object model information. The TENA packet generators interact with the TENA Execution Manager and with TENA subscribers. Notably, some of these TENA packet generator blocks are generic or agnostic as to object model, and some are specific to the object model of the instrument/sensor/test article being managed.

The generic logic blocks include GenericPubToEM packet generator 470, GenericEMtoPub packet generator 4750, and GenericPubToSub 480. GenericPubToEM packet generator 470 and GenericEMtoPub packet generator 4750 represent the two sides of a (logical) bi-directional communication link between the TENA gateway chip 220 (acting as publisher) and the TENA execution manager, where each handles communication in one direction of the bi-directional link. GenericPubToEM packet generator 470 performs the initialization process defined by TENA. After this internal initialization is complete, GenericPubToEM packet generator 470 and GenericEMtoPub packet generator 4750 then each examine TENA messages from the Execution Manager, and produce an appropriate TENA response message. GenericPubToEM packet generator 470 and GenericEMtoPub packet generator 4750 then each examine TENA messages from the Execution Manager, and produce an appropriate TENA response message.

Message type, content and order are defined by the TENA protocol. Notably, when GenericPubToEM packet generator 470 acts on a TENA message that was forwarded by TCP packet handler 445, the TENA reply message is generic, i.e., not unique to a particular object model. That is, the types of TENA requests forwarded to GenericPubToEM packet generator 470 by TCP packet handler 445 (based on a TENA message type) do not require object model specific data. Similarly, when GenericEMtoPub packet generator 4750 acts on a TENA message that was forwarded by TCP packet handler 445, the TENA reply message is generic, because the forwarded request does not require object model specific data. Finally, GenericPubToSub 480 processes TINA Messages between publisher and subscriber, ones that don't involve the Execution Manager.

For object-model specific communications with the Execution Manager and any object model subscribers, the TENA gateway chip 220 utilizes object-model-specific blocks: ObjectEMtoPub packet generator 485, and ObjectSub₁ToPub packet generator 490. These two blocks represent the two sides of a (logical) bi-directional communication link between the TENA gateway chip 220 (acting as publisher) and a TENA subscriber, where each handles communication in one direction of the bi-directional link. Some embodiments of TENA gateway chip 220 support multiple subscribers by including additional subscriber-to-publisher generators (i.e., ObjectSub₂ToPub . . . ObjectSub$_n$-ToPub).

In contrast to the generic communications with the Execution Manager that were discussed above, processing those types of TENA requests that are forwarded to ObjectEMto-Pub packet generator 485 (based on a TENA message type) require object model specific data. Therefore, ObjectEMto-Pub packet generator 485 examines TENA messages from the Execution Manager and utilizes data in object data storage 415 to produce an appropriate TENA response message that is unique to the object model being used.

In an analogous manner, processing the types of TENA requests forwarded to ObjectSub₁ToPub packet generator 490 require object model specific data, so ObjectSub₁ToPub packet generator 490 examines TENA messages from the Execution Manager and produces an appropriate TENA response Message that is unique to the object model being used. When these response messages include instrument data, ObjectSub₁ToPub packet generator 490 obtains the data from instrument data storage 420. If the format of the instrument data is different than that defined by the object model, ObjectSub₁ToPub packet generator 490 also performs conversion when inserting the data into the reply message.

Figure 5:
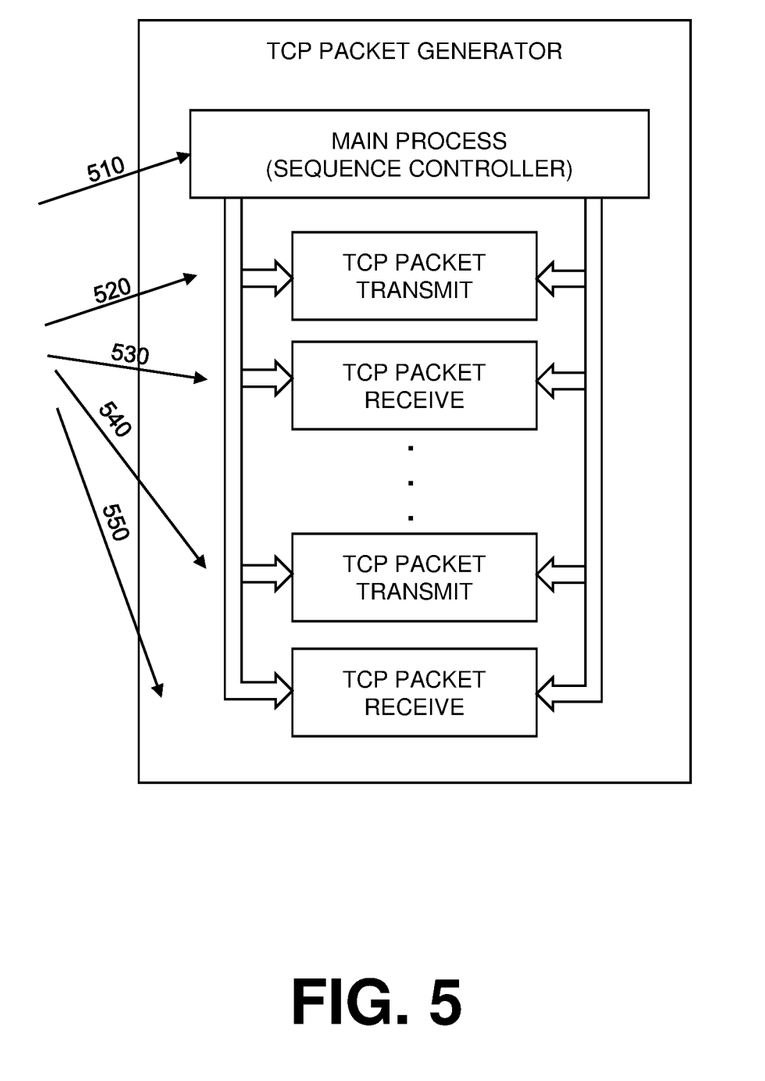
FIG. 5 is a block level diagram that shows the relationship between a main high level description language (HDL) process and a subordinate HDL process.

FIG. 5 is a Hock level diagram that shows the relationship between a main high level description language (HDL) process and a subordinate HIM, process. Main HDL process 510 controls the sequence of execution for subordinate HDL, processes that transmit and receive TCP packets (520-550). Each subordinate HDL process 520-550 extracts required information from MAC layer packets received from a TENA Execution Manager, TENA Subscriber, or TENA Publisher, or creates and generates MAC layer packets that are transmitted to the TENA Execution Manager/subscriber/publisher.

Several features described herein allow a designer to more easily modify the design to support a different object model corresponding to a different instrument, test article, or sensor. As described above, the object model specifics are generally separated from the generic (object model agnostic) parts of the design. Partitioning functionality between object-model specific logic blocks and generic (model agnostic) logic blocks allows the designer to replace the object-model specific blocks and re-use the generic blocks. Also, storing object model data and instrument data rather than including this data directly in the packet generator logic allows the designer to support a new object model by simply changing the data itself while possibly keeping the packet generator logic as is. Or, if more specific changes are necessary to support the new object model, the designer can revise only the format conversion portion of the packet generator logic.

What is claimed is:

1. A specialized integrated circuit for a Test and Training Enabling Architecture (TENA) gateway, the specialized integrated circuit comprising:
   a packet parser logic block configured to parse an incoming MAC layer packet, the incoming MAC layer packet including one more packet headers;
   a TCP packet handler logic block; and
   a plurality of TENA packet generator logic blocks,
   wherein the packet parser logic block is configured to parse an incoming MAC layer packet and to conditionally provide a TCP packet to the TCP packet handler depending on the one or ore packet headers in the incoming MAC layer packet,
   wherein the TCP packet handler logic block is configured to parse the TCP packet and selectively provide a TENA message to one of the TENA packet generator logic blocks, wherein the selected one of the TENA packet generator logic blocks is configured to construct an outgoing TENA message in response to the provided TENA message, wherein the operation of the packet parser logic block and the TCP packet handler logic block and the TENA packet generator logic blocks is concurrent.

2. The specialized integrated circuit of claim 1, wherein the plurality of one or more generic TENA packet generator logic blocks includes one or more generic TENA packet generator logic blocks and one or more object model specific TENA packet generator logic blocks.

3. The specialized integrated circuit of claim 2,
wherein the TCP packet handler logic block is configured to revealing a TENA message in the TCP packet, and to determine whether the TENA message involves object model specific data, and to selectively provide the TENA message to the one or more generic TENA packet generator logic blocks or the one or more object model specific TENA packet generator logic blocks, the selection based on the object model specific data determination.

4. The specialized integrated circuit of claim 2, further comprising:
object model storage,
wherein the one or more object model specific TENA packet generator logic blocks are further configured to obtain object model specific data from the object model storage, and
wherein the selected one of the object model TENA packet generator logic blocks is further configured to construct the outgoing TENA message based on the obtained object model specific data.

5. The specialized integrated circuit of claim 2, further comprising:
instrument data storage,
wherein at least one of the plurality of object model specific TENA packet generator logic blocks is further configured to obtain instrument data from the instrument data storage;
wherein the at least one of the object model TENA packet generator logic blocks is configured to construct another outgoing TINA message based on the obtained instrument data.

6. A specialized integrated circuit for a Test and Training Enabling Architecture (TENA) gateway, the specialized integrated circuit comprising:
a packet parser logic block configured to parse an incoming MAC layer packet, the incoming MAC layer packet including one more packet headers;
a TCP packet handler logic block;
a plurality of one or more TENA packet generator logic blocks, including one or more generic TENA packet generator logic blocks and one or more object model specific TENA packet generator logic blocks,
wherein the packet parser logic block is configured to parse an incoming MAC layer packet and to conditionally provide a TCP packet to the TCP packet handler depending on the one or more packet headers in the incoming MAC layer packet,
wherein the TCP packet handler logic block is configured to parse the TCP packet thereby revealing a TENA message, and to determine whether the TENA message involves object model specific data, and to selectively provide the TENA message to the one or more generic TENA packet generator logic blocks or the one or more object model specific TENA packet generator logic blocks, the selection based on the object model specific data determination,
wherein the selected one of the TENA packet generator logic blocks is configured to construct an outgoing TENA message in response to the provided TENA message.

7. The specialized integrated circuit of claim 6, further comprising:
object model storage,
wherein the one or more object model specific TENA packet generator logic blocks are further configured to obtain object model specific data from the object model storage, and
wherein the selected one of the object model specific TENA packet generator logic blocks is further configured to construct the outgoing TENA message based on the obtained object model specific data.

8. The specialized integrated circuit of claim 6, further comprising:
instrument data storage,
wherein at least one of the one or more object Model specific TENA packet generator logic blocks is further configured to obtain instrument data from the instrument data storage;
wherein the at least one of the object model specific TENA packet generator logic blocks is configured to construct another outgoing TENA message based on the obtained instrument data.

9. The specialized integrated circuit of claim 6, wherein the operation of the packet parser logic block and the TCP packet handler logic block and the TENA packet generator logic blocks is concurrent.

10. A specialized integrated circuit for a Test and Training Enabling Architecture (TENA) gateway, the specialized integrated circuit comprising:
object model storage;
a plurality of object model specific TENA packet generator logic blocks configured to obtain object model specific data from the object model storage;
a TCP packet handler logic block configured to parse an incoming TCP packet thereby revealing a TENA message, to determine whether the TENA message is of a type that involves object model specific data, and
wherein the TCP packet handler logic block is further configured to selectively provide the TENA message to one of the plurality of object model specific TENA packet generator logic blocks, the selection based on the determination,
wherein the selected one of the object model TENA packet generator logic blocks is further configured to construct an outgoing TENA message that is based on the obtained object model specific data, the construction in response to the provided TENA message.

11. The specialized integrated circuit of claim 10, further comprising:
instrument data storage,
wherein at least one of the plurality of object model specific TENA packet generator logic blocks is further configured to obtain instrument data from the instrument data storage;
wherein the at least one of the object model TENA packet generator logic blocks is configured to construct another outgoing TENA message based on the obtained instrument data.

12. The specialized integrated circuit of claim 10, further comprising:

a packet parser logic block configured to parse an incoming MAC layer packet that includes one more packet headers, and further configured to parse an incoming MAC layer packet and to conditionally provide the incoming TCP packet to the TCP packet handler depending on the one or more packet headers in the incoming MAC layer packet.

13. The specialized integrated circuit of claim 10, wherein the plurality of object model specific TENA packet generator logic blocks comprises: p1 a first logic block configured to handle communication from a TENA publisher to a TENA subscriber; and a second logic block configured to handle communication from the TENA publisher to the TENA publisher.

14. The specialized integrated circuit of claim 10, further comprising:

one or more generic TENA packet generator logic blocks, wherein the TCP packet handler logic block is further configured to conditionally provide the TENA message to the one or more generic TENA packet generator logic blocks in response to the object model specific data determination that the TENA message does not involve object model specific data.

15. The specialized integrated circuit of claim 10, wherein the operation of the packet parser logic block an the TCP packet handler logic block ad the TENA packet generator logic blocks is concurrent.

* * * * *